(12) United States Patent
Nishizawa et al.

(10) Patent No.: US 7,352,588 B2
(45) Date of Patent: Apr. 1, 2008

(54) SEMICONDUCTOR DEVICE AND A METHOD FOR MANUFACTURING THE SAME

(75) Inventors: Hirotaka Nishizawa, Fuchu (JP); Tamaki Wada, Higashimurayama (JP); Kenji Osawa, Hachioji (JP); Junichiro Osako, Takasaki (JP); Michiaki Sugiyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/371,929

(22) Filed: Mar. 10, 2006

(65) Prior Publication Data

US 2006/0205280 A1   Sep. 14, 2006

(30) Foreign Application Priority Data

Mar. 11, 2005   (JP)   ............................. 2005-068362

(51) Int. Cl.
   *H05K 1/14*   (2006.01)
   *H05K 1/18*   (2006.01)
   *H01L 29/40*  (2006.01)

(52) U.S. Cl. ..................... 361/737; 361/764; 257/777

(58) Field of Classification Search ............... 361/776, 361/772, 773, 774, 760, 807, 737, 764; 257/686, 257/685, 777
   See application file for complete search history.

(56) References Cited

U.S. PATENT DOCUMENTS

| 6,661,089 | B2 * | 12/2003 | Huang ..................... 257/704 |
| 6,985,363 | B2 * | 1/2006 | Yagi et al. ................. 361/760 |
| 2001/0003049 | A1 * | 6/2001 | Fukasawa et al. .......... 438/127 |
| 2005/0052830 | A1 * | 3/2005 | Bauer et al. ............... 361/679 |

FOREIGN PATENT DOCUMENTS

WO   WO 01/84490 A1   11/2001

* cited by examiner

*Primary Examiner*—Tuan T. Dinh
*Assistant Examiner*—Sheldon Soon
(74) *Attorney, Agent, or Firm*—Miles & Stockbridge P.C.

(57) ABSTRACT

A semiconductor device comprising a first wiring board having a plurality of external connection terminals on one side, semiconductor chips mounted on the other side of the first wiring board and electrically connected to the first wiring board by a plurality of wires, a sealing resin for sealing the semiconductor chips and the wires, and a second wiring board having a plurality of contact points on one side and bonded to the top surface of the sealing resin on the other side, wherein
   the upper end portions of the loops of the plurality of wires for electrically connecting the first wiring board to the semiconductor chips are exposed from the top surface of the sealing resin and electrically connected to the second wiring board.

14 Claims, 16 Drawing Sheets

SEMICONDUCTOR DEVICE AND A METHOD FOR MANUFACTURING THE SAME

CROSS-REFERENCE TO RELATED APPLICATION

The present application claims priority from Japanese patent application No. 2005-068362 filed on Mar. 11, 2005, the content of which is hereby incorporated by reference into this application.

BACKGROUND OF THE INVENTION

The present invention relates to a semiconductor device and a method for manufacturing the same. Specifically, it relates to a technology which is effectively applied to an SIM card having outside dimensions based on MINI-UICC standards.

A portable telephone has various functions such as net connection, mail transmission, picture taking and navigation functions in addition to telephone functions. Nowadays, a security function like a contact or non-contact IC card is further added to the portable telephone. Small-sized thin cards having a large number of functions have been developed in the field of cards which are inserted into the card slot of a portable telephone to cope with an increasing number of functions for the portable telephone.

WO01/84490 (patent document 1) discloses this type of a multi-function memory card.
Patent document 1: WO01/84490

SUMMARY OF THE INVENTION

One of SIM (Subscriber Identity Module) cards for use with a GSM type portable telephone is a small-sized SIM card having outside dimensions based on Mini-UICC standards.

This small-sized SIM card has outside dimensions which are about half the outside dimensions of the existing SIM card, and most part of the surface of the card is occupied by contact points having ISO (International Standardization Organization) standard-based outside dimensions like SIM cards and IC cards.

Therefore, when a memory chip is to be added to the inside of a card in order to increase the number of functions of this small-sized SIM card, the external connection terminal of the added chip cannot be arranged on the surface of the card.

It is an object of the present invention to provide a technology for promoting an increase in the number of functions of a small-sized SIM card having outside dimensions based on Mini-UICC standards.

The above and other objects and features of the present invention will become apparent from the following description when taken in conjunction with the accompanying drawings.

Out of the inventions disclosed by the present application, brief descriptions of typical inventions are given below.

The semiconductor device of the present invention comprises a first wiring board having a plurality of external connection terminals on one side, semiconductor chips mounted on the other side of the first wiring board and electrically connected to the first wiring board by a plurality of wires, a sealing resin for sealing the semiconductor chips and the wires, and a second wiring board having a plurality of contact points on one side and bonded to the top surface of the sealing resin on the other side, wherein the upper end portions of the loops of the plurality of wires for electrically connecting the first wiring board to the semiconductor chips are exposed from the top surface of the sealing resin and electrically connected to the second wiring board.

The method for manufacturing a semiconductor device of the present invention comprises the steps of:

(a) preparing a first wiring board having a plurality of external connection terminals on one side and a second wiring board having a plurality of contact points on one side;

(b) mounting semiconductor chips on the other side of the first wiring board and electrically connecting the first wiring board to the semiconductor chips by wires;

(c) placing the first wiring board in a mold in such a manner that the other side faces up, and bringing the upper end portions of the loops of the wires into contact with the top of the cavity of the mold;

(d) injecting a resin into the cavity to seal the semiconductor chips and the wires with the sealing resin and exposing the upper end portions of the loops of the wires from the top surface of the sealing resin; and (e) bonding the other side of the second wiring board to the top surface of the sealing resin to electrically connect the wires exposed from the top surface of the sealing resin to the second wiring board.

The effect obtained by the typical inventions out of inventions disclosed in this application is briefly described hereinbelow.

Since the semiconductor chips sandwiched between a first wiring board having a plurality of external connection terminals formed on one side and a second wiring board having a plurality of contact points on one side can be electrically connected to the first wiring board and the second wiring board, a large number of functions can be realized for a semiconductor device.

DETAILED DESCRIPTION OF THE PREFERRED EMBODIMENTS

Preferred embodiments of the present invention will be described in detail with reference to the accompanying drawings. In all the figures for explaining the embodiments, the same members are basically given the same reference symbols and their repeated descriptions are omitted.

An SIM card according to an embodiment of the present invention is a plug-in type multi-function SIM card having a security function like a contact or non-contact IC card and obtained by adding a large-capacity memory to an SIM card for use with a GSM type portable telephone.

Figure 1:
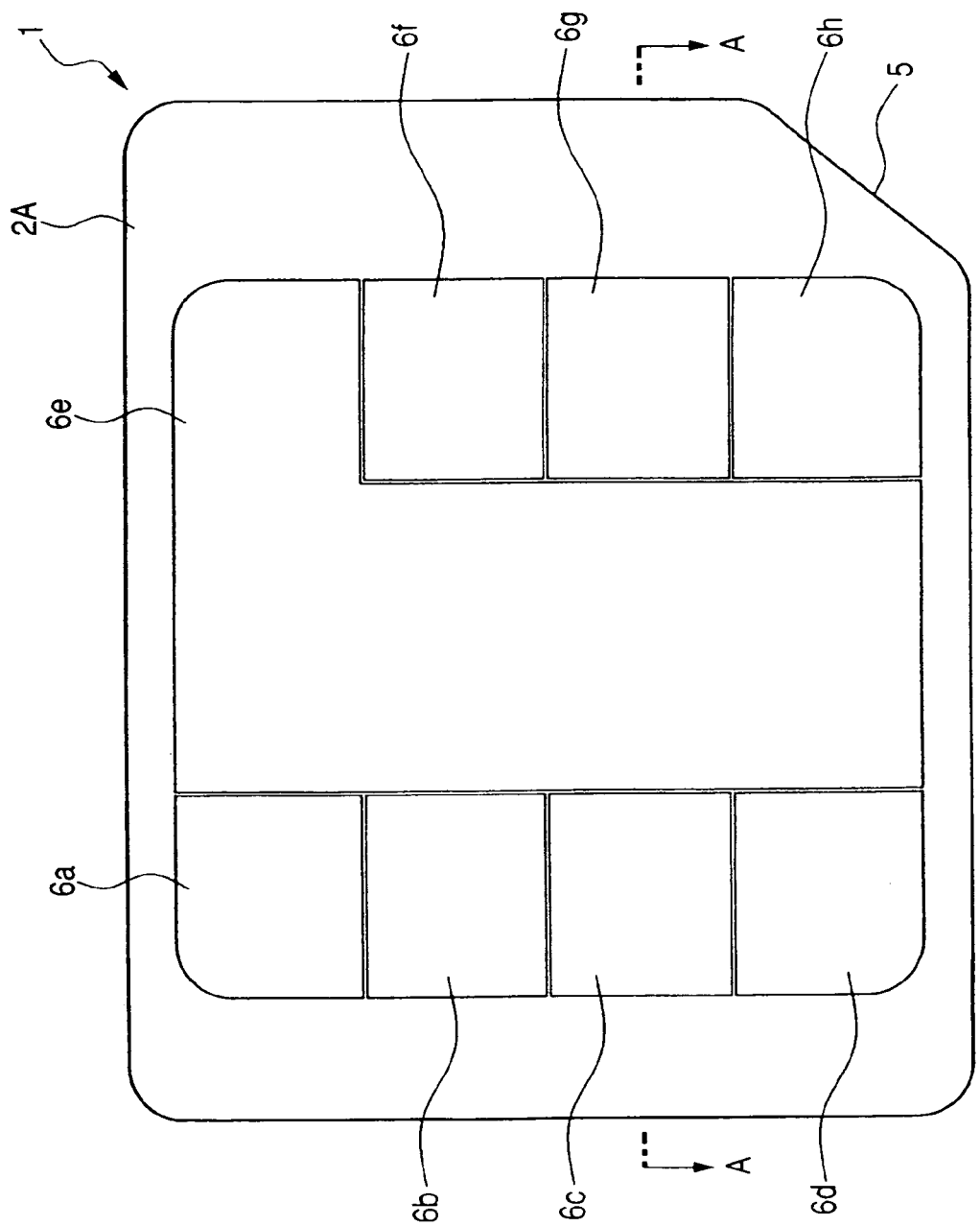
FIG. 1 is a plan view of an SIM card according to an embodiment of the present invention.
Figure 2:
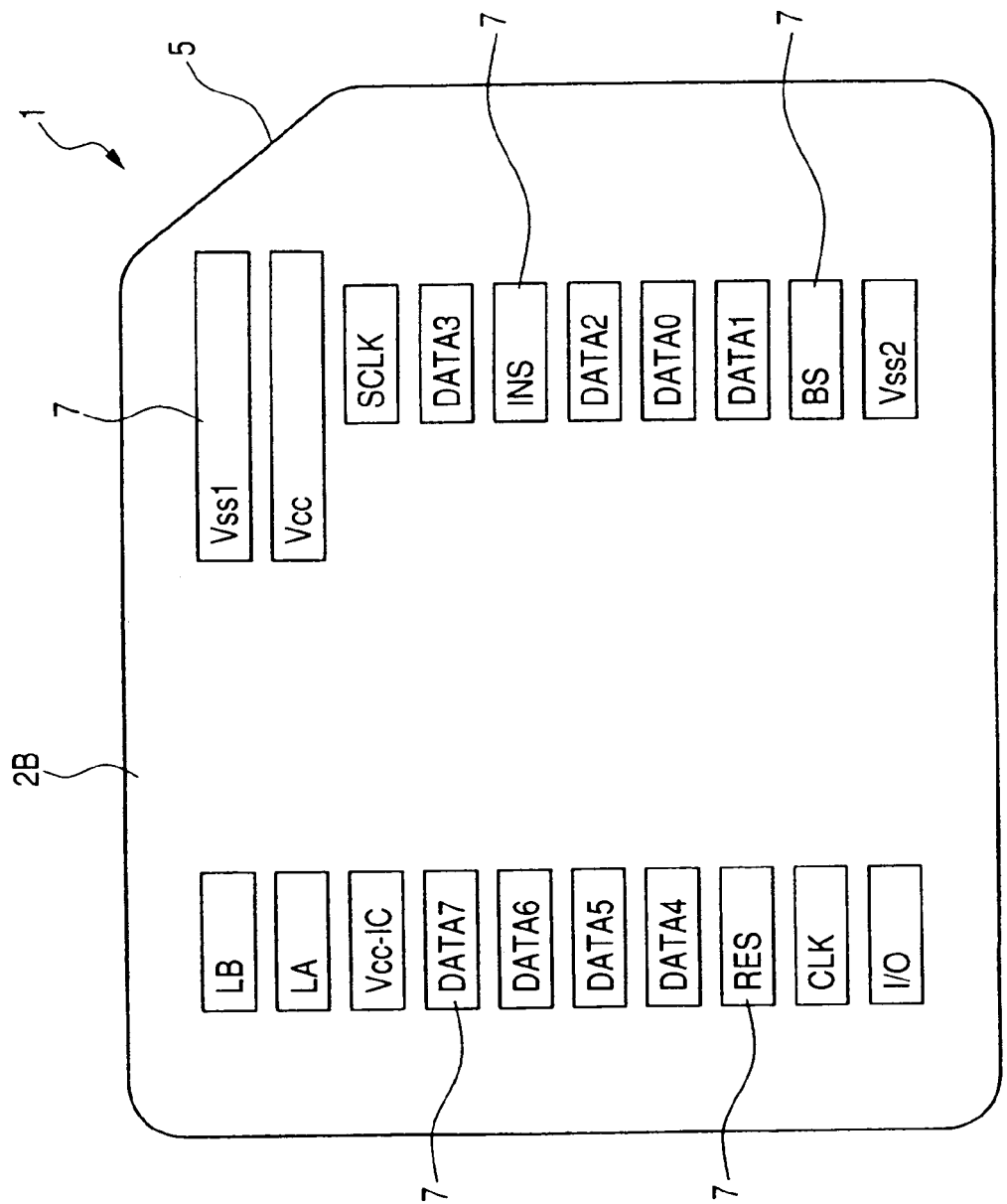
FIG. 2 is a plan view of the SIM card according to the above embodiment of the present invention.
Figure 3:
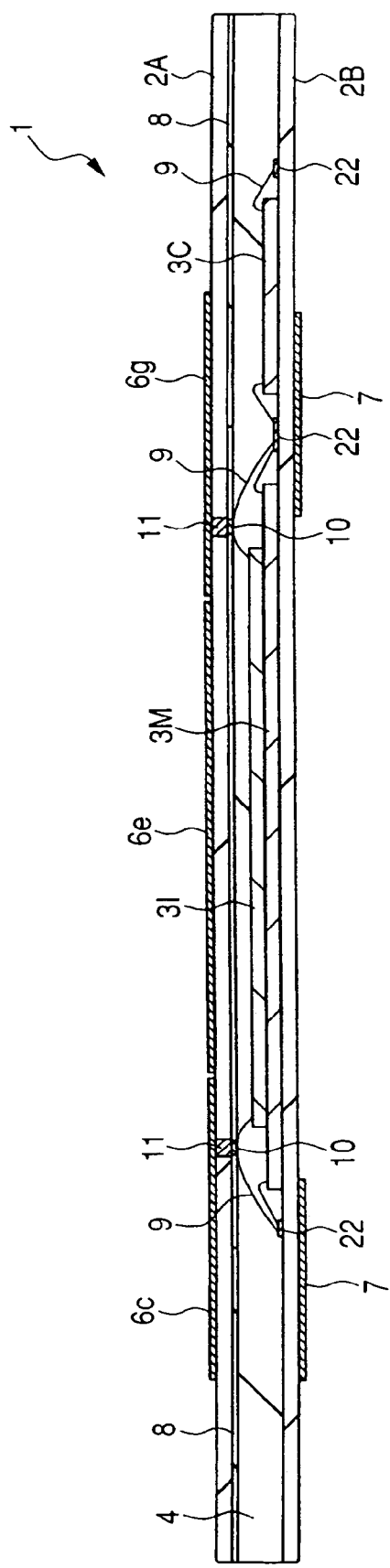
FIG. 3 is a sectional view of the SIM card cut along line A-A of FIG. 1.
Figure 4:
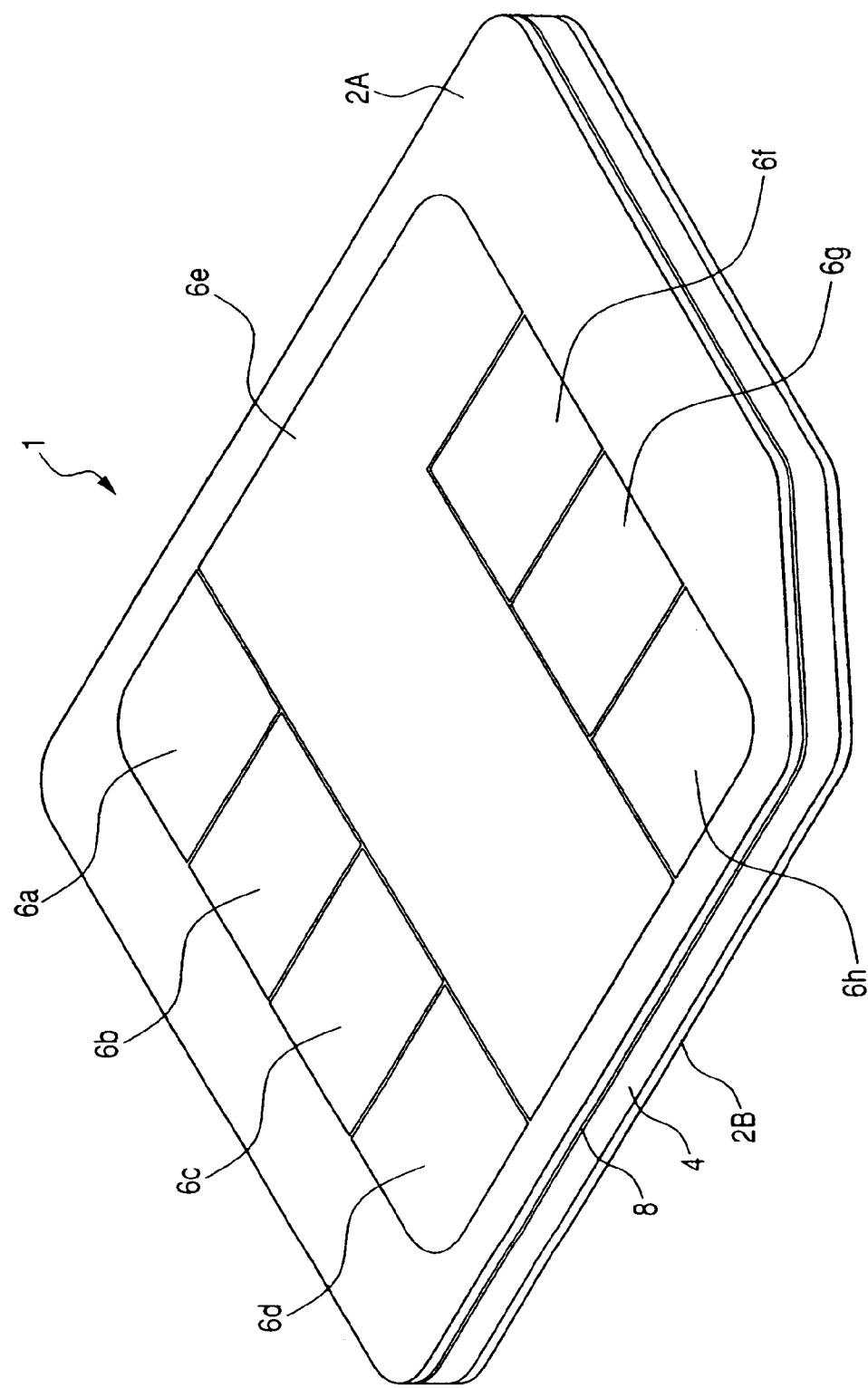
FIG. 4 is a perspective view of the SIM card according to the above embodiment of the present invention.

FIG. 1 and FIG. 2 are plan views showing the appearance of the SIM card of this embodiment. FIG. 1 shows a surface having contact points connected to an IC chip incorporated in the SIM card, and FIG. 2 shows a surface having external connection terminals connected to a memory chip incorporated in the SIM card. FIG. 3 is a sectional view of the key section of the SIM card cut along line A-A of FIG. 1, and FIG. 4 is a perspective view showing the appearance of the SIM card of this embodiment. In the following description, for convenience's sake, the contact point formed surface shown in FIG. 1 is the front side (top surface) of the SIM card and the external connection terminal formed surface shown in FIG. 2 is the rear side (under surface) of the SIM card.

The SIM card 1 of this embodiment comprises three semiconductor chips 3 (3I, 3M, 3C) between two wiring boards 2A and 2B (may be simply referred to as "substrates 2A and 2B" hereinafter), and these semiconductor chips 3 (3I, 3M, 3C) are sealed with a mold resin 4. As for the outside dimensions of the SIM card 1 which conform to Mini-UICC standards, the length of its long side is 15 mm, the length of its short side is 12 mm and its thickness is 0.78 mm. An oblique cutout 5 showing the direction for inserting the SIM card 1 into the card slot of a portable telephone is formed at one corner of the SIM card. The other corners are rounded with a curvature of about 0.8 mm.

As shown in FIG. 1 and FIG. 3, one surface of the wiring board 2A is exposed to the front surface of the SIM card 1. The main body of the wiring board 2A is made of a general-purpose resin such as glass epoxy resin, and eight contact points 6 (6a to 6h) constituting an interface with an external transmitter/receiver (reader/writer) are formed on one side. In this embodiment, for convenience's sake, these contact point 6 formed surface is expressed as the rear surface of the wiring board 2A and the surface connected to a mold resin 4 through an adhesive 8 is expressed as the top surface (front surface) of the wiring board 2a.

The contact points 6 are each composed of a copper foil electrode plated by nickel and gold and function as external terminals. The thickness of the wiring board 2A is about 0.15 mm including the body and the contact points 6. The contact points 6 function as external terminals for the IC chip 3I.

The distribution of signals to the eight contact points 6a to 6h is the same as that of the existing IC card and SIM card. That is, the contact point 6a is a power voltage supply terminal (Vcc), the contact point 6b is a reset signal terminal (RESET), the contact point 6c is a clock signal terminal (CLK), the contact point 6e is a ground voltage supply terminal (Vss), and the contact point 6g is an input/output signal terminal (I/O). The other contact points 6d, 6f and 6h which can be used in the future are non-connection terminals (NC) at present. Therefore, these non-connection terminals (contact points 6d, 6f, 6h) may be omitted according to the purpose of the SIM card.

As shown in FIG. 2 and FIG. 3, one side of the wiring board 2B is exposed to the rear side of the SIM card 1. The wiring board 2B has a body made of a general-purpose resin such as glass epoxy resin like the above wiring board 2A, and 20 external connection terminals 7 composed of a copper foil plated with nickel and gold are formed on one side of the wiring board 2B in such a manner that they are arranged in two rows along the short sides. The thickness of the wiring board 2B is about 0.15 mm which is the same as that of the wiring board 2A. In this embodiment, for convenience's sake, the external connection terminal 7 formed surface is expressed as the rear surface of the wiring board 2B and the semiconductor chip 3 formed surface is expressed as the top surface (front surface) of the wiring board 2B.

In this embodiment, the 20 external connection terminals 7 are formed on the rear surface of the wiring board 2B and include data terminals (DATA0 to DATA3), power voltage supply terminal (Vcc), power voltage supply terminal dedicated for an IC chip (Vcc-IC), ground voltage supply terminals (Vss1, Vss2), clock signal terminal (SCLK), plug-in/plug-out detection terminal (INS) and bus status terminal (BS) as the interface of a memorystic PRO. The antenna terminals of a non-contact IC card are external antenna connection terminals (LA, LB) The terminals of a contact IC card are reset signal terminal (RES), clock signal terminal (CLK) and input/output terminal (I/O). Terminals which can be used for an 8-bit data bus in the future are reserved terminals (DATA4 to DATA7). That is, these external connection terminals 7 function as the external terminals of a memory chip 3M.

Out of these external connection terminals, the power voltage supply terminal (Vcc) and the ground voltage supply terminals (Vss) are longer than the other external connection terminals 7. This is aimed to prevent the malfunction of the semiconductor chips 3 by contacting the power voltage supply terminal (Vcc) and the ground voltage supply terminal (Vss1) to the terminals of a connector so as to supply power before signals are supplied to the semiconductor chips 3 through the other external connection terminals 7 when the SIM card 1 is inserted into the connector of a portable telephone.

The SIM card 1 of this embodiment has external terminals on the front side and the rear side. That is, the external connection terminals 7 of the IC chip 3I are arranged on the front side of the SIM card 1 (rear surface of the wiring board 2A) and the external terminals 7 of the memory chip 3M are arranged on the rear side (rear side of the wiring board 2B) of the SIM card 1. As will be described in detail hereinafter, the number of functions of the SIM card can be increased due to this structure of the SIM card 1.

As shown in FIG. 3, three semiconductor chips 3 are interposed between the wiring board 2A and the wiring board 2B. These semiconductor chips 3 are mounted on the top surface of the wiring board 2B and sealed with a mold resin 4. The three semiconductor chips 3 are an IC chip 3I, a controller chip 3C and a memory chip 3M made of silicon and having a thickness of 0.03 to 0.30 mm.

Integrated circuits such as a central processing unit, ROM (Read Only Memory), RAM (Random Access memory) and EEPROM (Electrically Erasable Programmable RO) are formed on the main surface of the IC chip 3I. Execution programs and crypto algorithms are stored in the ROM. The RAM functions as a memory for data processing and the EEPROM functions as a memory for storing data.

A flash memory having a capacity of 32 MB to several GB is formed on the main surface of the memory chip 3M. The flash memory mainly functions as a memory for storing user data. Integrated circuits for controlling the interfaces of the IC chip 3I and the memory chip 3M are formed on the main surface of the controller chip 3C.

Out of the above three semiconductor chips 3, the memory chip 3M and the controller chip 3C are bonded to the top surface of the wiring board 2B and the IC chip 3I is bonded to the top surface of the memory chip 3M. These three semiconductor chips 3 are electrically connected to electrodes 22 on the top surface of the wiring board 2B from the electrodes (not shown) of the semiconductor chips 3 by gold wires 9, and the electrodes 22 on the wiring board 2B are electrically connected to the above external connection terminals 7 through via holes (not shown) formed in the wiring board 2B. That is, the three semiconductor chips 3 are electrically connected to the external connection terminals 7 through the gold wires 9, the electrodes of the semiconductor chips 3, the electrodes of the wiring board 2B and the via holes.

The mold resin 4 for sealing the three semiconductor chips 3 is a thermosetting epoxy resin containing a quartz filler and has a thickness of about 0.45 mm. The wiring board 2A is bonded to the top surface of the mold resin 4 by the adhesive 8. The above adhesive 8 interposed between the top surface of the mold resin 4 and the wiring board 2A is an epoxy resin-based non-conductive adhesive and has a thickness of about 0.03 mm.

Out of the above three semiconductor chips 3, the IC chip 3I formed on the memory chip 3M is also electrically connected to the contact points 6 of the wiring board 2A. That is, the upper end portions of the loops of the gold wires 9 for connecting the IC chip 3I to the wiring board 2B are slightly exposed from the top surface of the mold resin 4. The number of gold wires 9 exposed from the top surface of the mold resin 4 is, for example, five. The gold wires 9 exposed from the top surface of the mold resin 4 are coated with a conductive adhesive 10. Further, electrodes (not shown) connected to the respective five contact points (6a, 6b, 6c, 6e, 6g) excluding the above non-connected terminals (NC) and via holes 11 are formed in the wiring board 2A over the conductive adhesive 10. The five gold wires 9 whose upper end portions are exposed from the top surface of the mold resin 4 are electrically connected to the respective contact points (6a, 6b, 6c, 6e, 6g) through the conductive adhesive 10, electrodes and via holes 11.

The non-connection terminals (NC) may be used as antenna terminals for an RF interface or USB interface. By using the non-connected terminals (NC), the SIM card 1 can have more functions.

FIG. 4 is a perspective view of the SIM card 1 of this embodiment. As shown in FIG. 4, the front side of the SIM card 1 is covered by the wiring board 2A, the rear side of the SIM card 1 is covered by the wiring board 2B, and the mold resin 4 and the adhesive 8 are exposed to the side surfaces of the SIM card 1. As will be described hereinafter, the production time and the production cost of the SIM card 1 can be reduced by this structure.

A description is subsequently given of an example of the method for manufacturing the SIM card constituted as described above of this embodiment.

Figure 5:
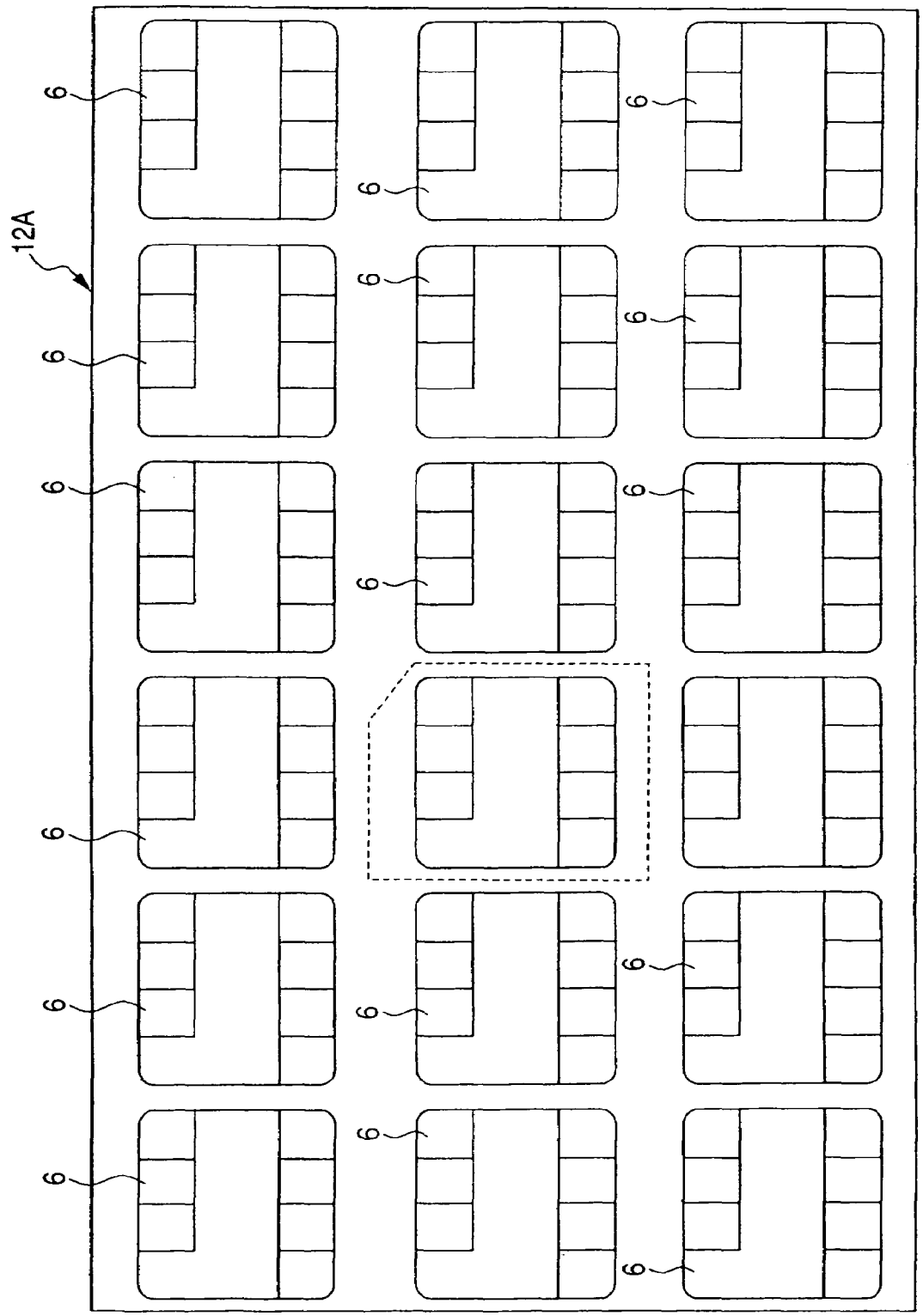
FIG. 5 is a plan view of a first large-sized wiring board used for the manufacture of the SIM card of the above embodiment.
Figure 6:
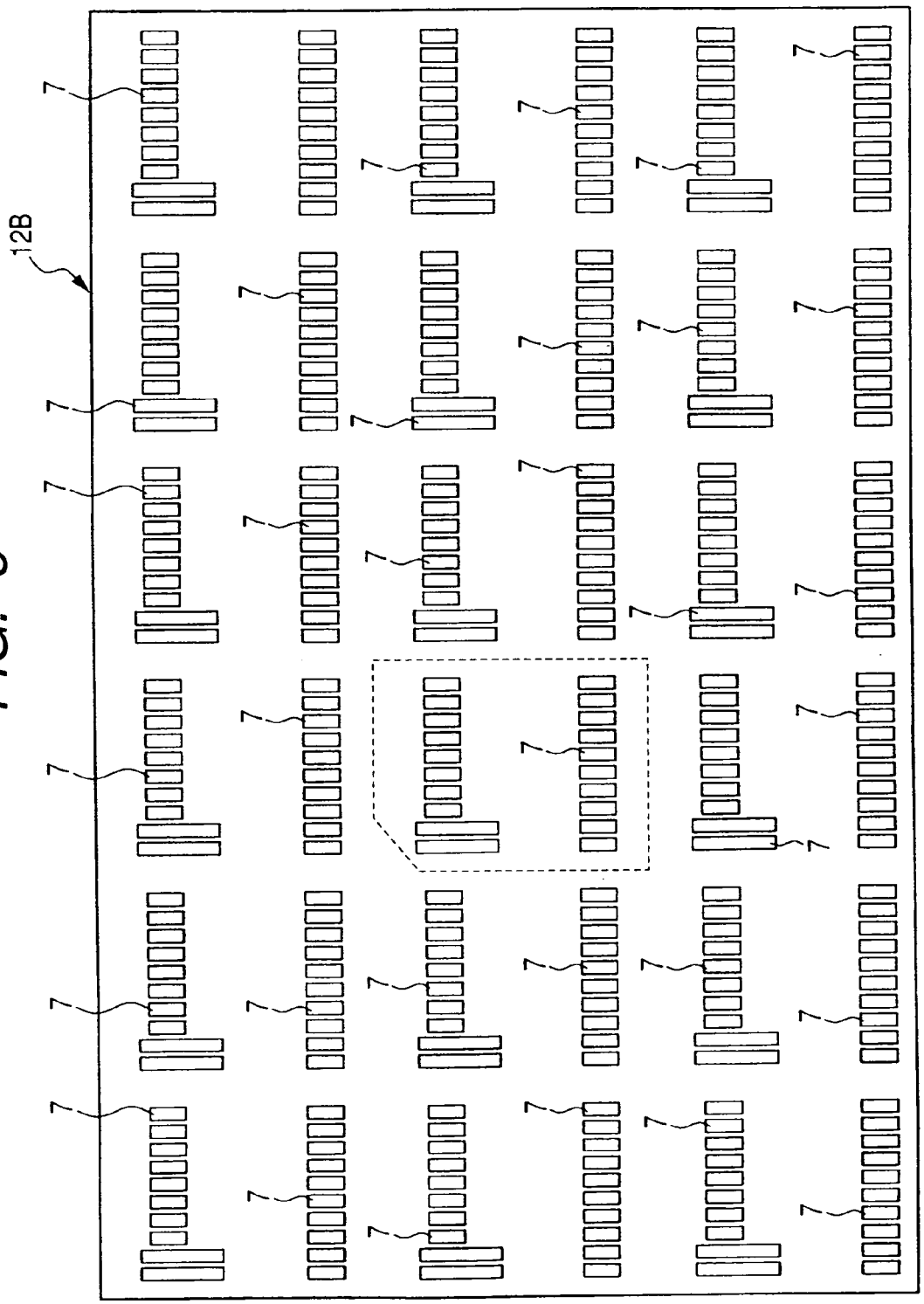
FIG. 6 is a plan view of a second large-sized wiring board used for the manufacture of the SIM card of the above embodiment of the present invention.

FIG. 5 is a plan view of a large-sized wiring board 12A used for the manufacture of an SIM card and FIG. 6 is a plan view of a large-sized wiring board 12B used for the manufacture of an SIM card.

The large-sized wiring board 12A shown in FIG. 5 has a plurality of sets of the contact points (6a to 6h) of the wiring board 2A shown in FIG. 1 which are arranged in a matrix, and the area shown by a broken line in the figure is an area (unit) occupied by one wiring board 2A. The large-sized wiring board 12B shown in FIG. 6 has a plurality of sets of the 20 external connection terminals 7 of the wiring board 2B shown in FIG. 2 which are arranged in a matrix, and the area shown by a broken line in the figure is an area (unit) occupied by one wiring board 2B. Although not shown, via holes 11 and electrodes connected to the contact points (6a, 6b, 6c, 6e, 6g) are formed in each unit of the large-sized wiring board 12A. Similarly, via holes and electrodes 22 connected to the external connection terminals 7 are formed in each unit of the large-sized wiring board 12B.

Figure 7:
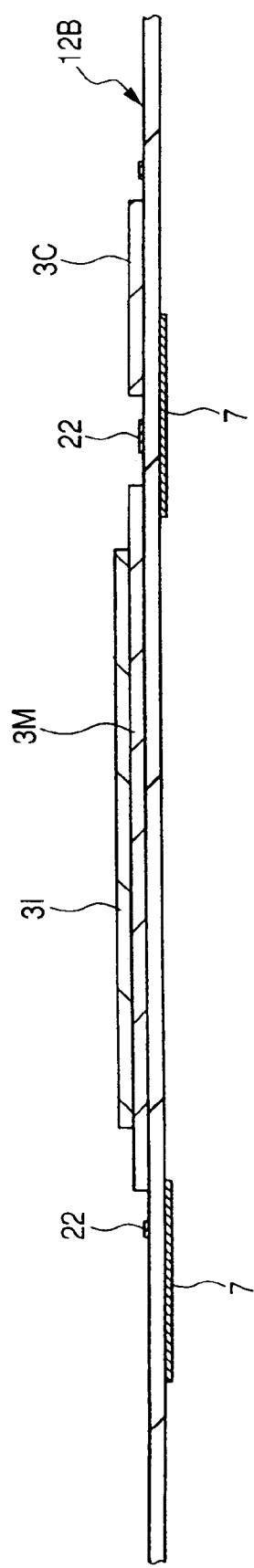
FIG. 7 is a sectional view showing a chip mounting step for the SIM card according to the above embodiment of the present invention.

To manufacture an SIM card, as shown in FIG. 7, three semiconductor chips 3 are first mounted on each unit of the large-sized wiring board 12B. The top surface of the large-sized wiring board 12B will become the top surface of the wiring board 2B on which the semiconductor chips 3 will be mounted. The rear surface of the large-sized wiring board 12B will become the rear surface of the wiring board 2B on which the external connection terminals 7 will be formed.

The controller chip 3C and the memory chip 3M are bonded to the top surface of the large-sized wiring board 12B by pellets using an adhesive or an adhesive film (not shown), and the IC chip 3I is bonded to the memory chip 3M by pellets using an adhesive or an adhesive film (not shown). The reason why the IC chip 3I is formed on the memory chip 3M at this point is that the memory chip 3M is larger than the IC chip 3I and has a large area. If an IC chip 3I having a relatively small area is formed under the memory chip 3M, there will occur such inconvenience that the IC chip 3I cannot be connected by the gold wire. Therefore, in this embodiment, a chip having a relatively large surface area is arranged at a lower position and a chip having a relatively small surface area is formed above the chip. As for the arrangement of the IC chip 3I, the IC chip 3I is arranged such that its periphery does not project from the outer periphery of the memory chip 3M. That is, the IC chip 3I is arranged on the inner side of the outer periphery of the memory chip 3M. By arranging the IC chip 3I as described above, as shown in FIG. 3, the degree of freedom of the area where the gold wire 9 is arranged can be increased.

Figure 8:
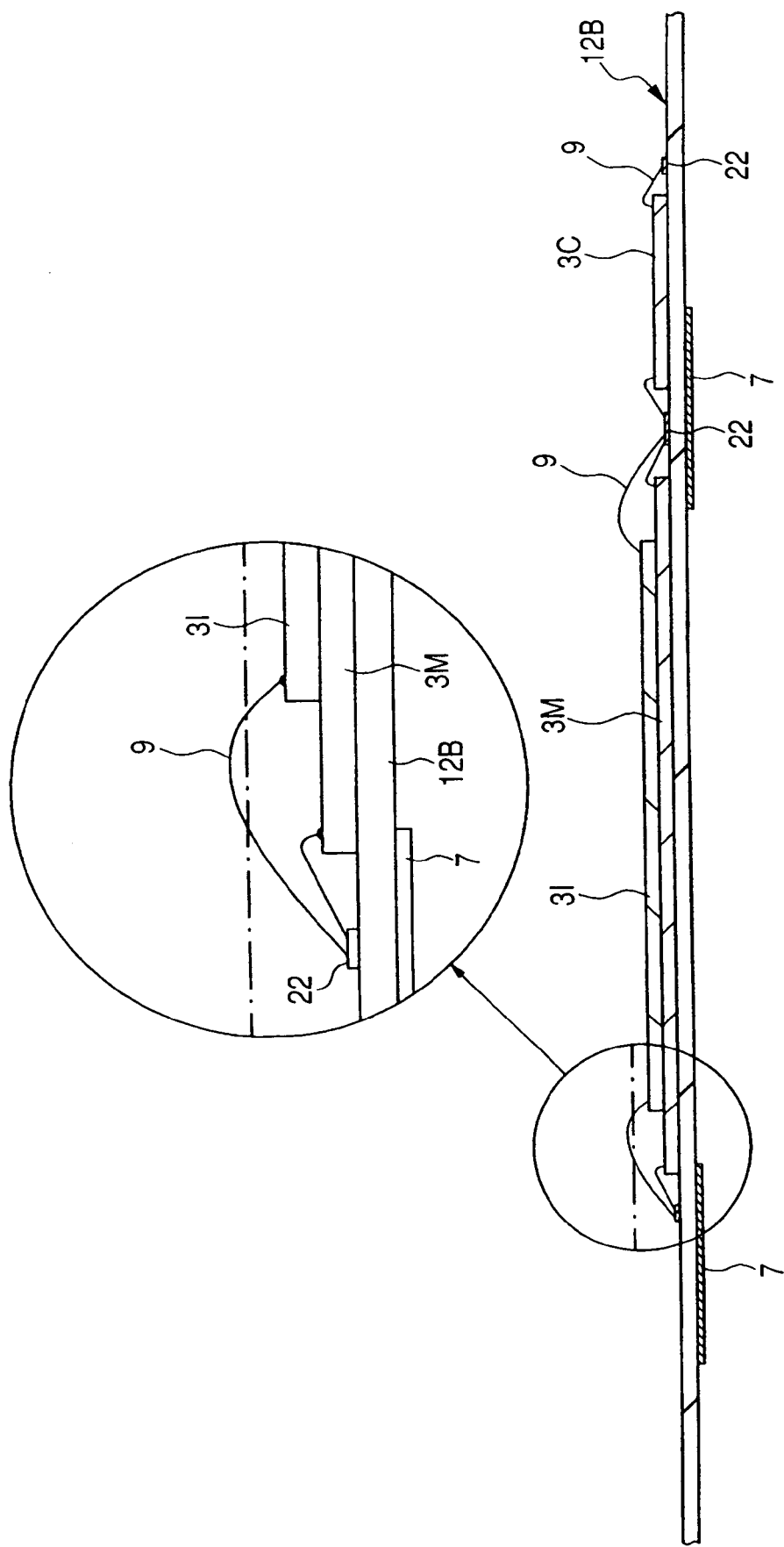
FIG. 8 is a sectional view showing a wire bonding step for the SIM card of the above embodiment of the present invention.

Thereafter, as shown in FIG. 8, the three semiconductor chips 3 are connected to the respective electrodes (not shown) of the large-sized wiring board 12B by the gold wires 9 using a widely-known wire bonding apparatus. At this point, the gold wires 9 for connecting the electrodes of the large-sized wiring board 12B to the IC chip 3I are bonded such that the upper end portions of their loops become higher than the top surface (position shown by a one-dotted chain line in the figure) of the mold resin 4 to be molded later. That is, the height of the gold wire 9 is set above the height of the mold resin 4 with the top surface of the wiring board 12B as a standard. The gold wire (first wire) 9 for connecting the IC chip 3I to the electrode 22 of the wiring board 12B is set higher than the gold wire (second wire) 9 for connecting the memory chip 3M to the electrode 22 of the wiring board 12B. This is intended to prevent contact between the first wire 9 and the second wire 9.

Figure 9:
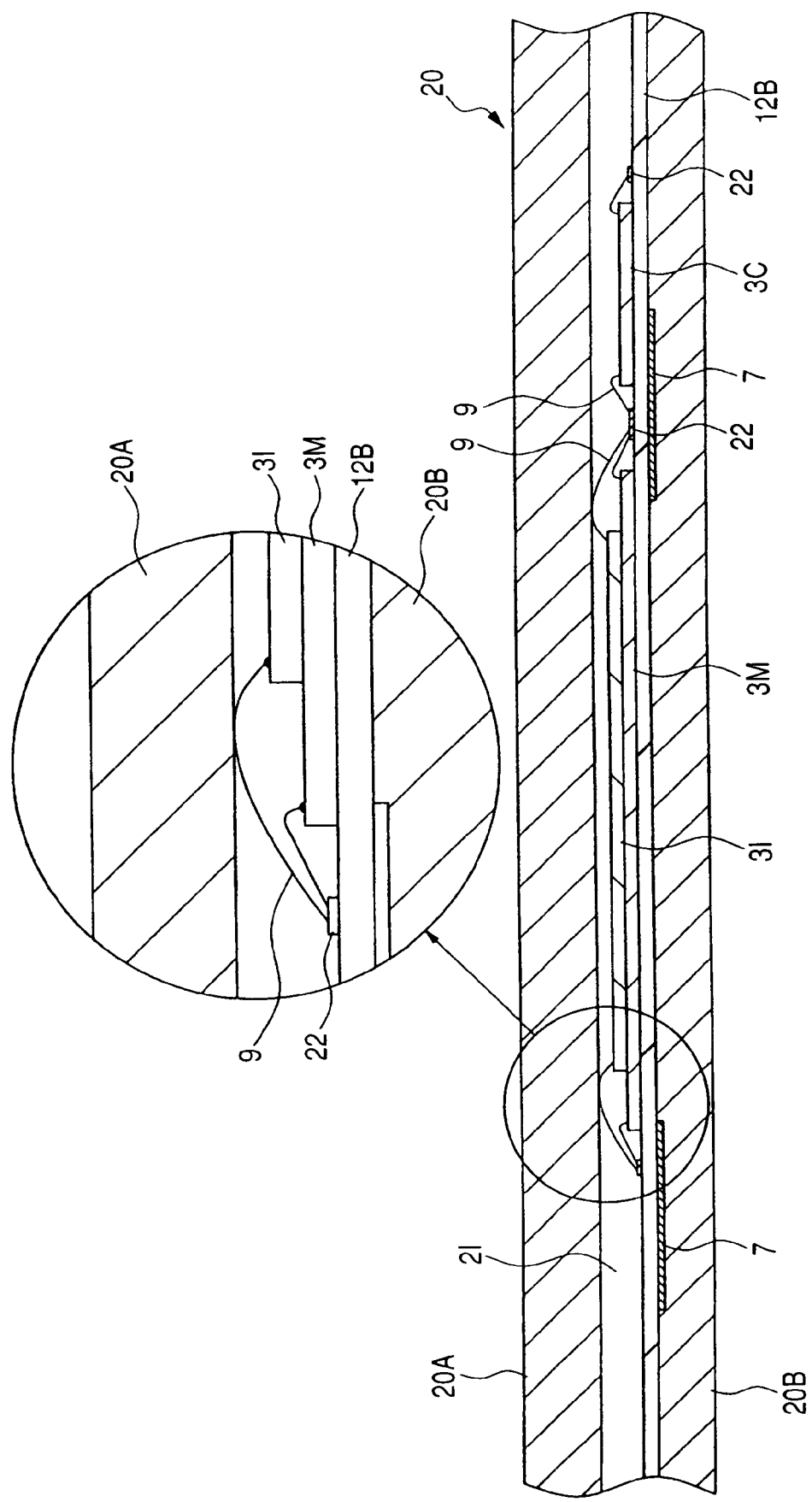
FIG. 9 is a sectional view showing a resin molding step for the SIM card of the above embodiment of the present invention.

Then, as shown in FIG. 9, the above large-sized wiring board 12B is placed in the cavity 21 of a mold 20 consisting of an upper mold 20A and a lower mold 20B. By doing this, the upper end portion of the gold wire 9 connected to the IC chip 3I is brought into close contact with the surface of the upper mold 20A by elastic deformation. Since the gold wire 9 is elastic and easily deforms, even when its upper end portion is pressed against the upper mold 20A, the contact portion between the IC chip 3I and the gold wire 9 is not damaged.

Figure 10:
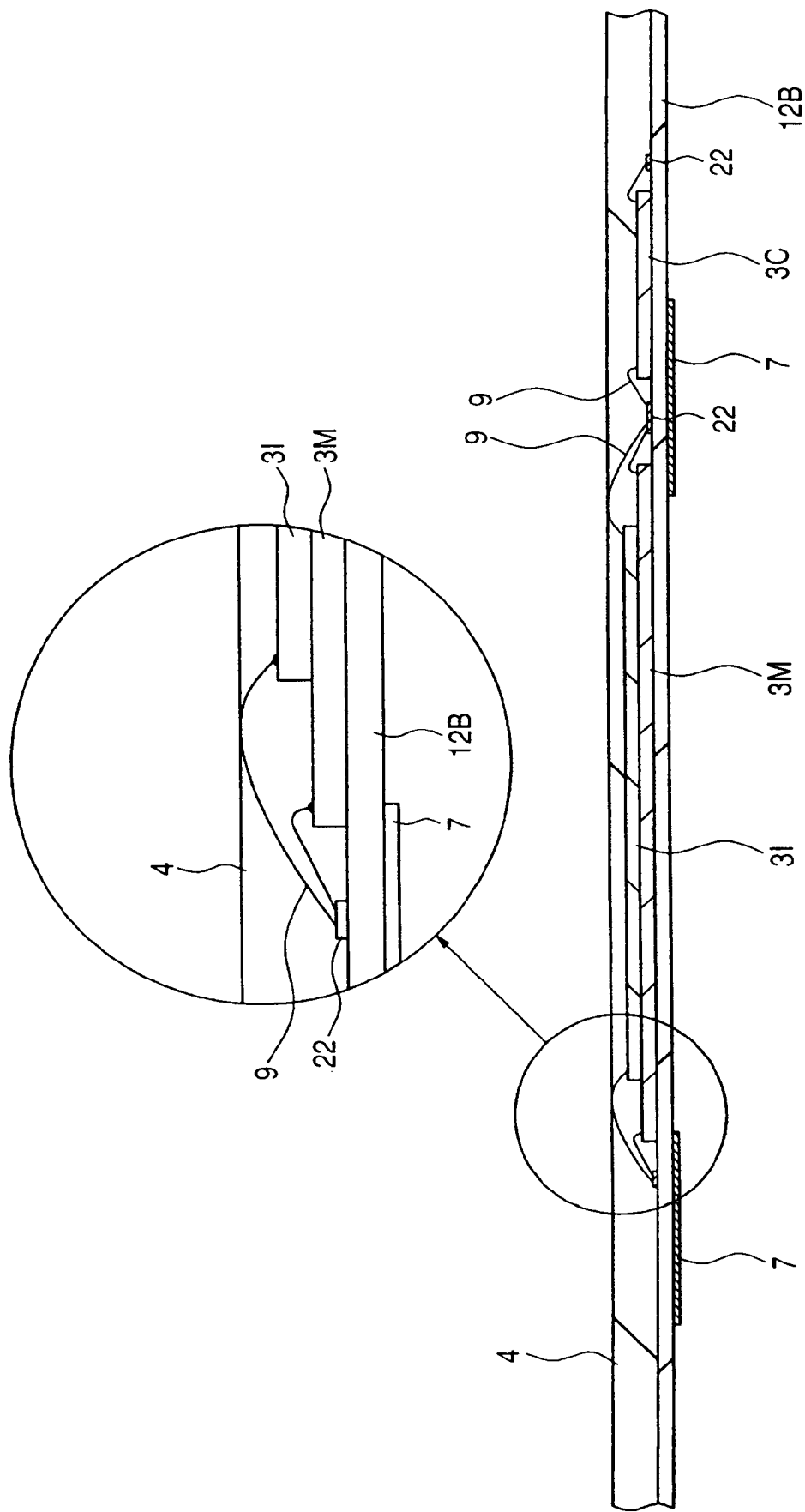
FIG. 10 is a sectional view showing a flush burr removing step for the SIM card of the above embodiment of the present invention.

After a molten resin is injected into the cavity 21 of the mold 20 to mold the mold resin 4, the large-sized wiring board 12B is taken out of the mold 20 (FIG. 10). Although the upper end portions of the gold wires 9 connected to the IC chip 3I become the same height as the top surface of the mold resin 4 at this point, very thin resin flush burrs adhere to the surfaces of the upper end portions of the gold wires 9.

By removing the thin flush burrs covering the upper end portions of the gold wires 9, the upper end portions of the gold wires 9 are exposed from the top surface of the mold resin 4 to a certain extent. That is, the gold wires 9 are partially exposed from the top surface of the mold resin 4. To remove the flush burrs, the top surface of the mold resin 4 is vaporized by using a laser beam having a short wavelength, or is sputtered. Or, the top surface of the mold resin 4 may be blasted. Further, a jet of high-pressure water may be applied from the end of a nozzle, or etching using a chemical for dissolving the mold resin 4 may be employed.

Figure 11:
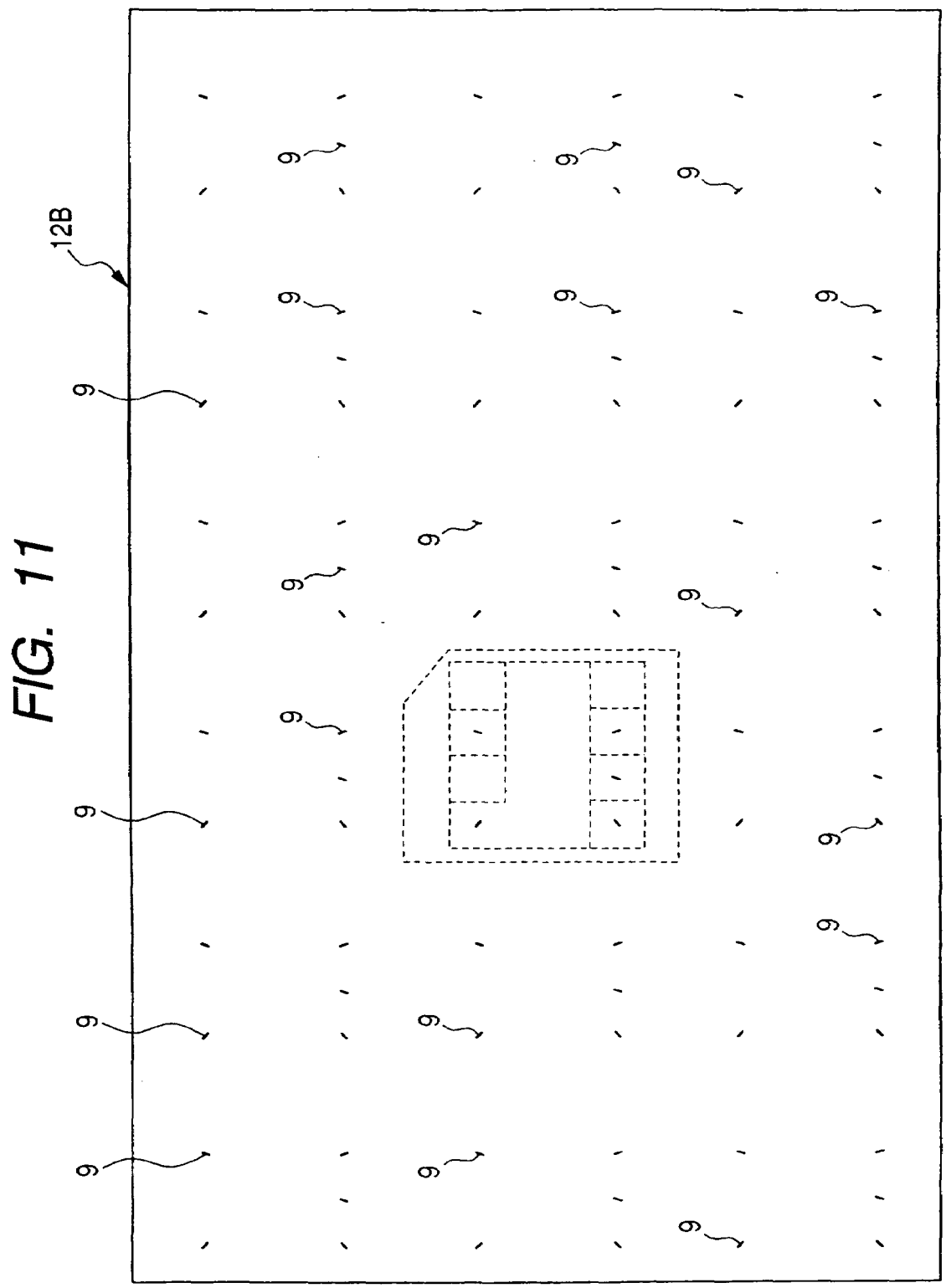
FIG. 11 is a plan view showing the method for manufacturing the SIM card after the step shown in FIG. 10.

FIG. 11 is a plan view of the top surface of the mold resin 4 after the flush burrs have been removed. As shown in the figure, the upper end portions of the gold wires 9 are exposed to positions corresponding to the contact points (6*a*, 6*b*, 6*c*, 6*e*, 6*g*) of each unit.

Figure 12:
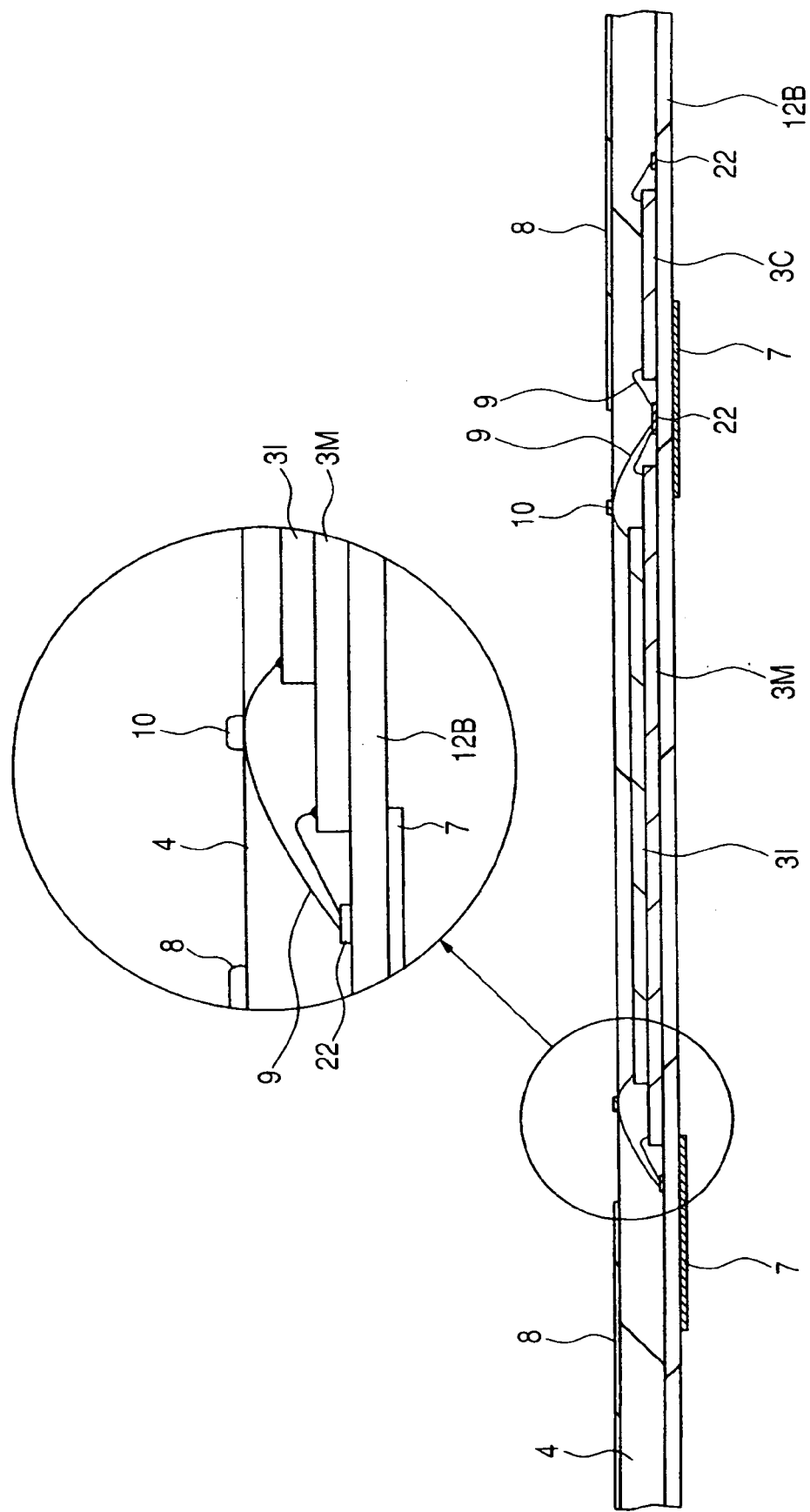
FIG. 12 is a sectional view showing the method for manufacturing the SIM card after the step shown in FIG. 11.

As shown in FIG. 12, the conductive adhesive 10 is then applied to the top portions of the gold wires 9 exposed from the top surface of the mold resin 4. The application of the conductive adhesive 10 is carried out by screen printing or potting, for example. The non-conductive adhesive 8 is applied to the area excluding the areas from which the gold wires 9 are exposed out of the top surface of the mold resin 4. To simplify the application work of the adhesives, the conductive adhesive 10 may be applied to the area where the non-conductive adhesive 8 will be applied and the top portions of the gold wires 9 at the same time. Preferably, the conductive adhesive 10 applied to the top portions of the gold wires 9 has such high elasticity that it can easily deform when the large-sized wiring board 12A is bonded to the top surface of the mold resin 4 in the subsequent step.

Figure 13:
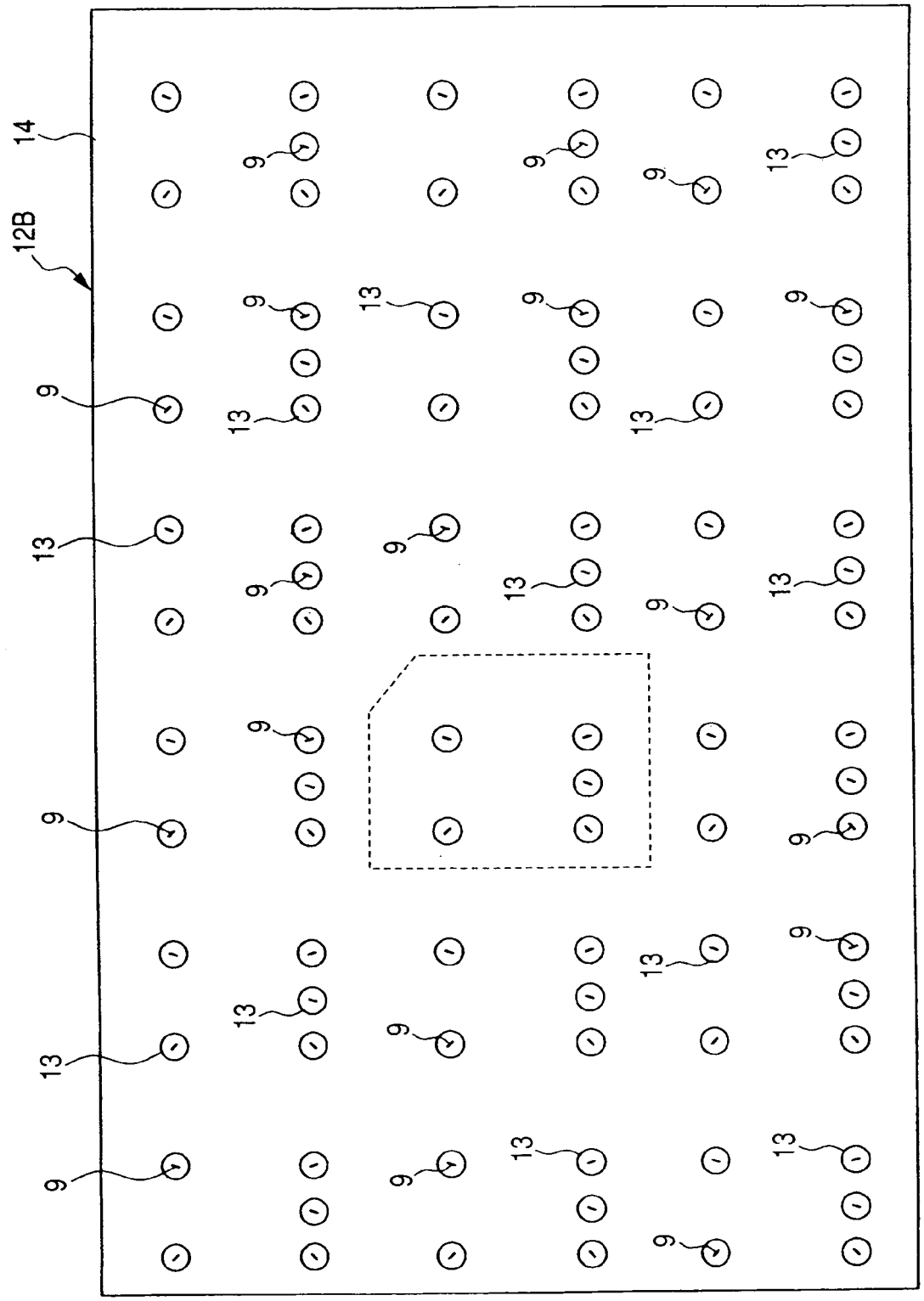
FIG. 13 is a plan view showing another example of the method for manufacturing the SIM card.

In place of the above method, as shown in FIG. 13, an adhesive sheet 14 having openings 13 around the gold wires 9 may be bonded to the entire top surface of the mold resin 4, and the conductive adhesive 10 may be applied to the top portions of the gold wires 9 before or after the above step. Alternately, an anisotropic conductive film having an adhesive coat on both sides may be bonded to the entire top surface of the mold resin 4. Since electrodes connected to the via holes 11 are formed on one surface (opposed to the mold resin 4) of the large-sized wiring board 12A, when the anisotropic conductive film is bonded to the top surface of the mold resin 4 and the large-sized wiring board 12A is placed on the anisotropic conductive film, only parts of the anisotropic conductive film at positions in contact with the electrodes becomes conductive, thereby making it possible to electrically connect the gold wires 9 to the electrodes.

Figure 14:
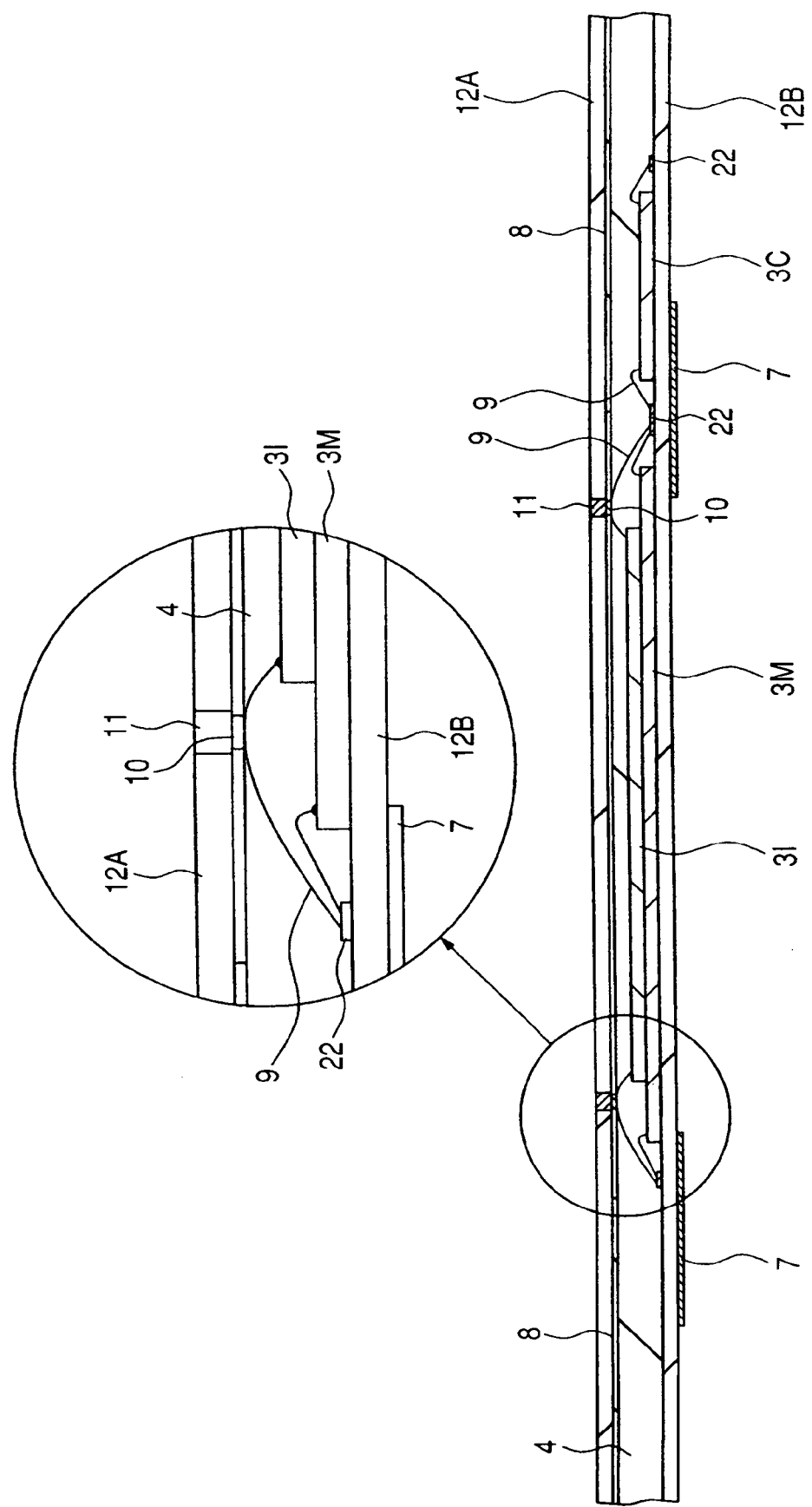
FIG. 14 is a sectional view showing the method for manufacturing the SIM card after the step shown in FIG. 12.

Thereafter, as shown in FIG. 14, the large-sized wiring board 12A is placed on the top surface of the mold resin 4 and bonded to the mold resin 4 by the adhesive 8. Thereby, the contact points (6*a*, 6*b*, 6*c*, 6*e*, 6*g*) are electrically connected to the gold wires 9 through the conductive adhesive 10 applied to the top portions of the gold wires 9, the electrodes of the large-sized wiring board 12A and the via holes 11.

Then, the large-sized wiring board 12A, the mold resin 4 and the large-sized wiring board 12B are cut along the outer circumferences of the units to obtain the SIM cards of this embodiment shown in FIGS. 1 to 4. Since the oblique cutout 5 must be formed at one corner of the SIM card 1 and the other corners must be rounded as described above, by cutting the large-sized wiring boards 12A and 12B and the mold resin 4 with a jet of high-pressure wafer from the end of the nozzle, cutting can be carried out simultaneously with the formation of the cutout 5 and the rounding of the corners. Water jet cutting and dicing are used in combination so that dicing is used to cut linear portions and water jet cutting is used to form the cutout 5 and round the corners. Since dicing cuts faster than water jet cutting, when water jet cutting and dicing are used in combination, the cutting time can be shortened as compared with a case where only water jet cutting is used. Since the linear portions can be cut at once by dicing when the SIM card 1 is formed by this manufacturing method, the production cost per SIM card 1 can be cut.

In this embodiment, the large-sized wiring boards 12A and 12B are used to carry out molding. The method for manufacturing the SIM card 1 is not limited to this and transfer molding in which each SIM card 1 is sealed individually may be employed.

While the invention made by the inventors of the present invention has been described in detail based on the preferred embodiment, it is needless to say that the present invention is not limited to the above embodiment and may be modified without departing from the scope of the invention.

For example, in this embodiment, the SIM card 1 comprises the memory chip 3M, the IC chip 3I and the controller chip 3C. However, the SIM card 1 may be constituted such that the IC chip 3I and the controller chip 3C are integrated to one chip.

Figure 15:
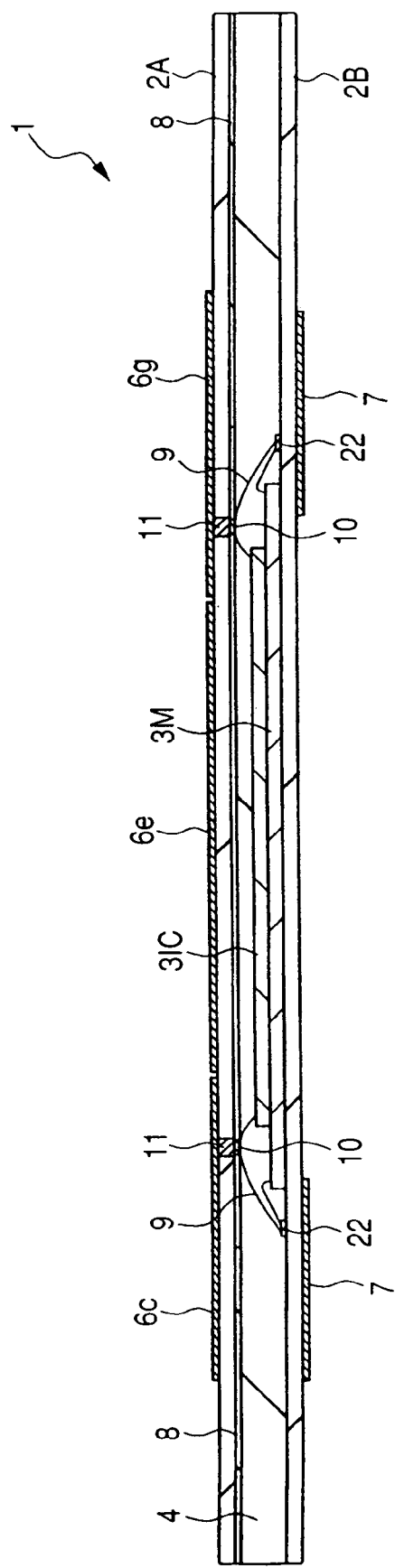
FIG. 15 is a sectional view of an SIM card according to another embodiment of the present invention.

That is, as shown in FIG. 15, the SIM card 1 has a two-chip structure that a chip 3IC including an IC chip and a controller chip is existent on the memory chip 3 M having a flash memory. Gold wires (first wires) 9 exposed from the top surface of the mold resin 4 and gold wires (second wires) 9 not exposed from the top surface of the mold resin extend from the chip 3IC. The above first wires 9 are connected to the contact points 6 through the conductive adhesive 10 and the via holes 11 and to the external connection terminals 7 through the electrodes 22 formed on the wiring board 2B. The above second wires 9 are formed at a height lower than the above first wires 9 and are connected to the external connection terminals 7 through the electrodes 22 formed on the wiring board 2B. When the SIM card 1 has the above two-chip structure, the space of the controller chip 3C can be eliminated, which is effective for the microfabrication of the SIM card 1. A chip having another function or a flash memory chip can be mounted on the above space. In this case, it is possible to further increase the number of functions or the capacity of the SIM card 1.

Figure 16:
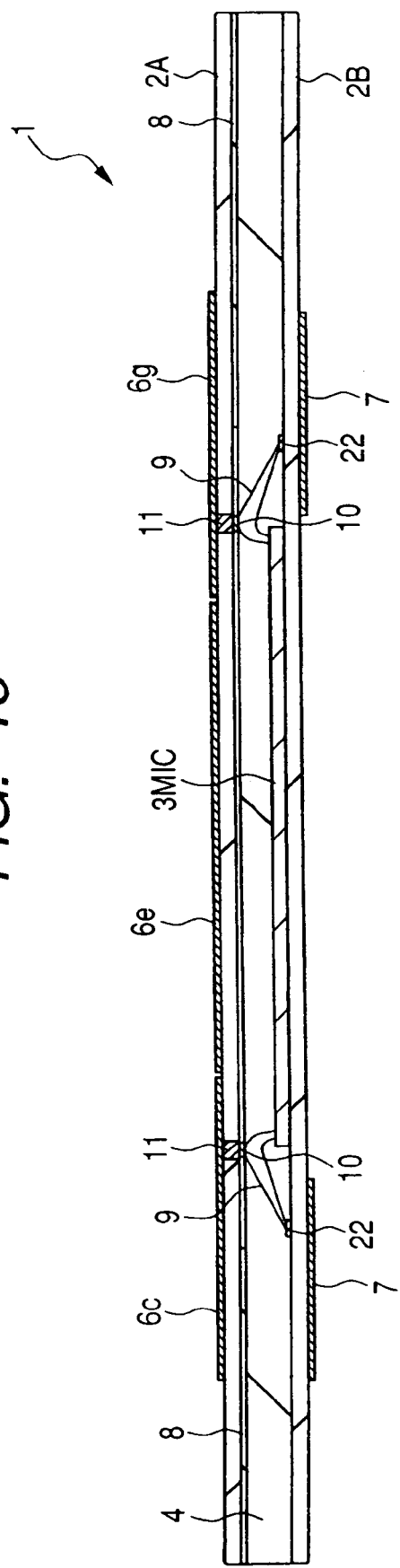
FIG. 16 is a sectional view of an SIM card according to still another embodiment of the present invention.

As shown in FIG. 16, the present invention can be applied to a case where the memory chip 3M and the chip 3IC including the IC chip and the controller chip are integrated to one chip to manufacture a chip 3MIC. As compared with the above two-chip structure, it is possible to further enhance the level of microfabrication and increase the number of functions or the capacity of the SIM card 1. Since the thickness of the chip can be reduced by the one-chip structure, the thickness of the SIM card 1 can be reduced.

In the above embodiment, a multi-function SIM card having memory card functions and SIM card functions has been described. The functions of the card are not limited to these functions. For example, the present invention can be applied to a card having various functions such as a card having only memory card functions, a card having only SIM card functions or a card including semiconductor chips having functions different from those of a memory card and an SIM card. For example, in this embodiment, a memorystic PRO as shown in FIG. 2 is given as the interface of the SIM card 1 but the present invention is not limited to this and may be an interface terminal structure according to purpose, such as a multi-media card, SD card or USB.

The types and number of semiconductor chips to be mounted on the wiring board and a combination of these semiconductor chips may be changed according to the functions of a card. For instance, in a card having only memory card functions, a system can be constructed with one or more memory chips having a nonvolatile memory from and to which data can be electrically erased or written and an interface controller chip for controlling memory interface operation for the memory chip(s) The number of external connection terminals on the wiring board for mounting semiconductor chips can be changed according to required functions. When the number of external connection terminals is small, all the external connection terminals can be arranged in a row.

The structure and manufacturing method of the present invention in which a wiring board over a sealing resin is connected to semiconductor chips by wires exposed from the top surface of the sealing resin can be applied to semiconductor packages other than cards.

Since the SIM card of the present invention can have various functions by changing the types and a combination of semiconductor chips to be mounted on the wiring board, it can be used not only as a multi-function SIM card but also as other composite function card and communication card.

What is claimed is:

1. A semiconductor device comprising:
    a first wiring board having a plurality of first external connection terminals over one side of the first wiring board;
    semiconductor chips mounted over another side of the first wiring board and electrically connected to the first wiring board by wires;
    a sealing resin sealing the semiconductor chips and parts of the wires; and
    a second wiring board having a plurality of second external connection terminals over one side of second wiring board and bonded to a top surface of said sealing resin on another side of the second wiring board,
    wherein upper end portions of loops of a plurality of the wires are exposed from the top surface of the sealing resin and electrically connected to the second wiring board,
    wherein the second terminals are provided in accordance with a mini-UICC standard, and
    wherein the first terminals provide an interface for a memory stick device, a multi-media card, an SD card, or a USB.

2. The semiconductor device according to claim 1, wherein a conductive adhesive is provided on the plurality of wires exposed from the top surface of the sealing resin, and the plurality of wires and the second wiring board are electrically interconnected through the conductive adhesive.

3. The semiconductor device according to claim 1, wherein the semiconductor chips include:
    a first semiconductor chip having an electrically erasable and writable non-volatile memory;
    a second semiconductor chip having an interface controller for controlling memory interface operation for the non-volatile memory; and
    a third semiconductor chip having an IC card microcomputer for carrying out processing based on an operation command given from the interface controller, the plurality of wires electrically connecting the first wiring board to the third semiconductor chip.

4. The semiconductor device according to claim 3, wherein the third semiconductor chip is disposed over the first semiconductor chip.

5. The semiconductor device according to claim 1, wherein the second wiring board is bonded to the top surface of the sealing resin by a non-conductive adhesive.

6. The semiconductor device according to claim 2, wherein the second wiring board is bonded to the top surface of the sealing resin by the conductive adhesive.

7. The semiconductor device according to claim 1, wherein the first wiring board, the second wiring board and the sealing resin have outside dimensions based on Mini-UICC standards.

8. A semiconductor device comprising:
    a first substrate having a top surface and a rear surface;
    a second substrate having a top surface and a rear surface;
    a first semiconductor chip disposed over the top surface of the first substrate between the top surface of the first substrate and the top surface of the second substrate;
    first terminals disposed over the rear surface of the first substrate and electrically connected to the first semiconductor chip;
    second terminals disposed over the rear surface of the second substrate and electrically connected to the first semiconductor chip;
    first wires electrically connected to the first semiconductor chip and to the first and second terminals;
    second wires electrically connected to the first semiconductor chip and to the second terminals; and
    a resin covering parts of the first wires, the second wires and the first semiconductor chip,
    wherein the first wires are partially exposed from the top surface of the resin,
    wherein a height of the first wires is higher than a height of the second wires based on the top surface of the first substrate,
    wherein the second terminals are provided in accordance with a mini-UICC standard, and
    wherein the first terminals provide an interface for a memory stick device, a multi-media card, an SD card, or a USB.

9. The semiconductor device according to claim 8, wherein a conductive adhesive is provided on the first wires exposed from the top surface of the resin, and the wires and the second substrate are electrically interconnected through the conductive adhesive.

10. The semiconductor device according to claim 8, wherein the second substrate is bonded to the top surface of the resin by non-conductive adhesive.

11. The semiconductor device according to claim 8, further comprising:

a third semiconductor chip disposed over the top surface of the first substrate;

wherein the first semiconductor chip has an electrically erasable and writable non-volatile memory;

wherein the third semiconductor chip has an interface controller for controlling memory interface operation for the non-volatile memory; and wherein the second semiconductor chip has an IC card microcomputer for carrying out processing based on an operation command given from the interface controller.

12. The semiconductor device according to claim 8, wherein the first substrate, the second substrate and the resin have outside dimensions based on mini-UICC standards.

13. The semiconductor device according to claim 8, wherein the first terminals include a power voltage supply terminal (Vcc), a reset signal terminal (RESET), a clock signal terminal (CLK), a ground voltage supply terminal (Vss) and an input/output signal terminal (I/O).

14. The semiconductor device according to claim 8, wherein the second terminals include four data terminals (DATA0 to DATA3), a power voltage supply terminal (Vcc), ground voltage supply terminals (Vss) and a clock signal terminal (SCLK).

* * * * *